United States Patent [19]

Lehovec

[11] 4,360,897
[45] Nov. 23, 1982

[54] MEMORY CELL COMPRISING TUNNEL DIODES AND FIELD EFFECT TRANSISTORS

[75] Inventor: Kurt Lehovec, Los Angeles, Calif.

[73] Assignee: University of Southern California, Los Angeles, Calif.

[21] Appl. No.: 94,571

[22] Filed: Nov. 15, 1979

Related U.S. Application Data

[63] Continuation-in-part of Ser. No. 928,543, Jul. 27, 1979, Pat. No. 4,242,595.

[51] Int. Cl.³ .............................................. G11C 11/38
[52] U.S. Cl. .................................... 365/159; 307/286; 365/175
[58] Field of Search ............... 307/448, 450, 458, 461, 307/286; 365/159, 175, 177

[56] References Cited

U.S. PATENT DOCUMENTS 4,242,595 12/1980 Lehovec .............................. 307/286

4,300,064 11/1981 Eden .................................. 307/458

OTHER PUBLICATIONS

Gaensslen et al., FET Memory Cell using Schottky Diodes as Load Devices, IBM Tech. Disc. Bul., vol. 13, No. 2, 7/70, pp. 302-303.
Landler, Dynamic Schottky Storage Cell, IBM Tech. Disc. Bul., vol. 17, No. 11, 4/75, pp. 3215-3216.

Primary Examiner—Stuart N. Hecker

[57] ABSTRACT

A static memory cell uses a micro-tunnel diode as load to a switching circuit involving field effect transistors. Another field effect transistor circuit is used as gate for read-address and read-out. The stationary current through the tunnel diode at logic zero is kept barely above the valley current to prevent aging. Close control of two threshold levels for the transistors in the memory cell is achieved by using the same dopant distribution in their channels in conjunction with a Schottky gate and a p-n junction gate.

10 Claims, 11 Drawing Figures

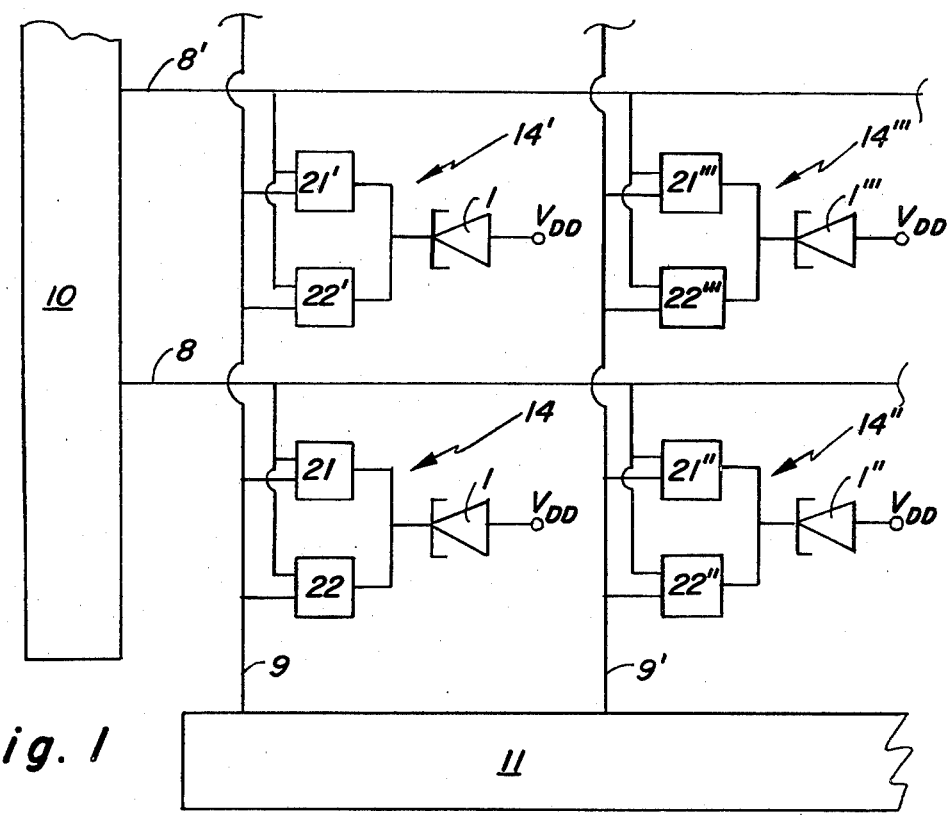
Fig. 1
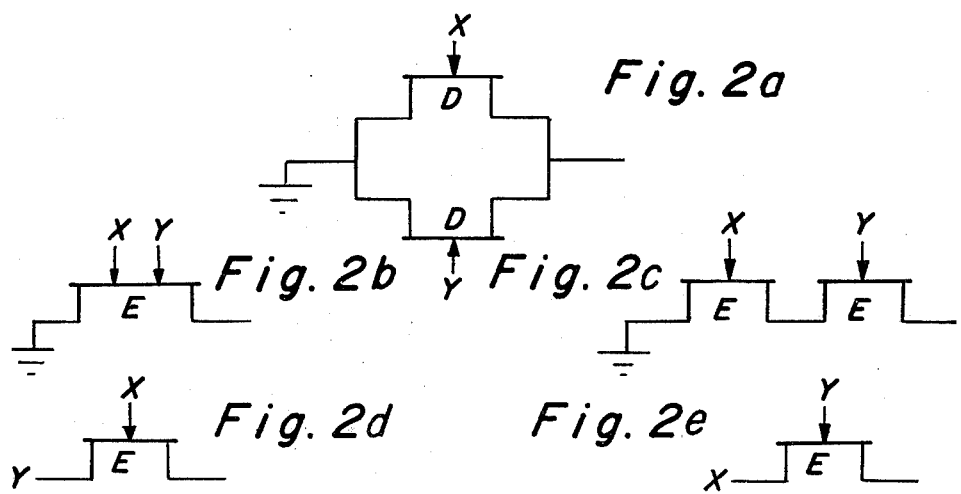
Fig. 2a
Fig. 2b
Fig. 2c
Fig. 2d
Fig. 2e

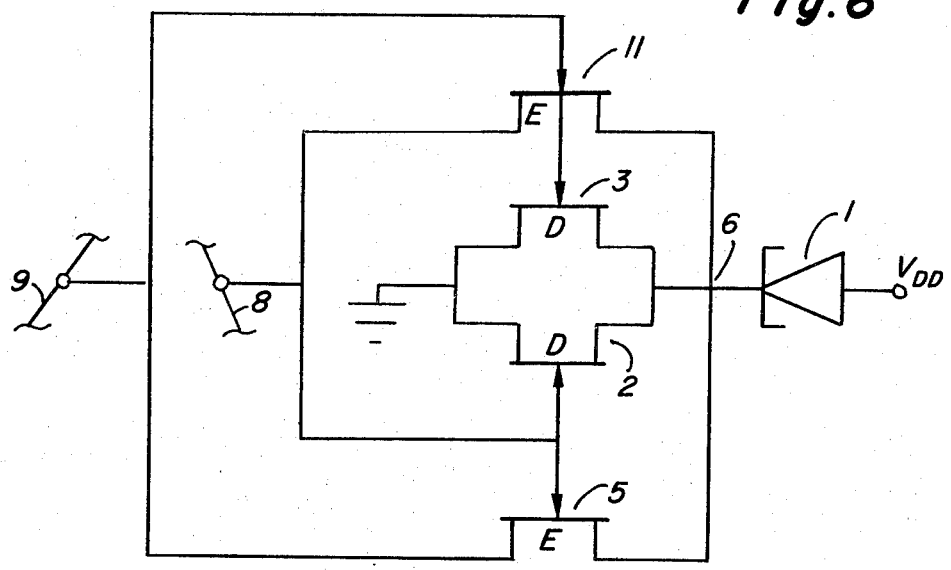
Fig. 6
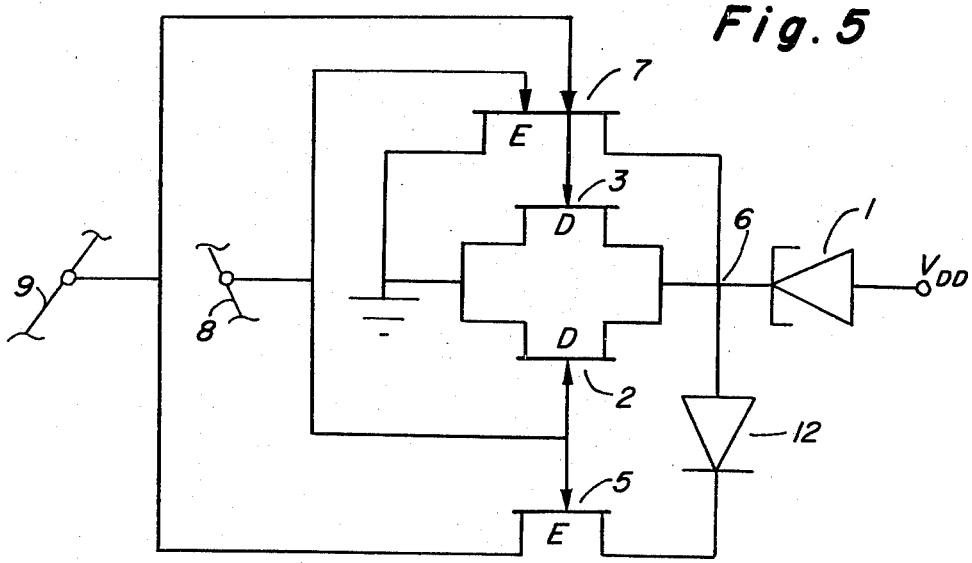
Fig. 5
Fig. 7
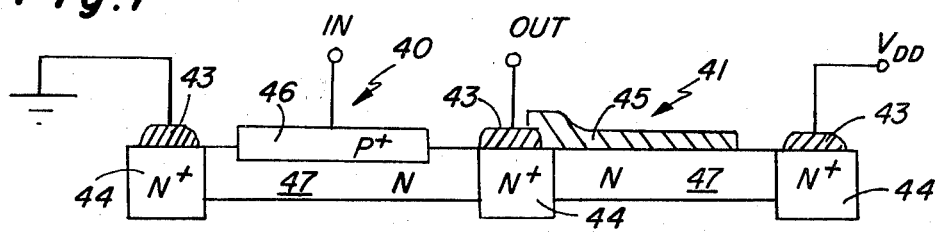

MEMORY CELL COMPRISING TUNNEL DIODES AND FIELD EFFECT TRANSISTORS

REFERENCE TO RELATED APPLICATIONS

This Application is a Continuation-in-Part to my pending Application Ser. No. 928,543 "Tunnel Diode Load for Ultra-Fast Low Power Switching Circuits", filed on July 27, 1979, now U.S. Pat. No. 4,242,595, hereafter referred to as the Parent Application.

BACKGROUND OF THE INVENTION

Recent interest in gigabit logic focuses on GaAs because its electron mobility is about six times that in silicon. Since the hole mobility in GaAs is much lower than its electron mobility, complementary circuits using n- and p-channel GaAs devices are not suitable for high speed data processing. Moreover, since there does not exist a natural oxide of good electric properties for GaAs, contrary to the case of silicon, GaAs transistors are of the Schottky barrier or $p^+$-n junction field effect transistor types, so called MESFET or JFET. These n-channel transistors require a suitable load element to complete an inverter circuit. In the Parent Application I have taught the use of micro-tunnel diodes as an improved load element.

Other logic functions such as AND, NAND, OR, and NOR gates can be composed from inverters by use of multiple switching elements, either cascaded or in parallel connection. Two transistors in series can be combined into a single dual gate transistor.

In addition to the logic functions just cited, data processing requires memory. Information is being processed in the binary system involving only two numbers "1" and "0" with any other number of the decimal system expressed as a series of "1" and "0". Memory storage of a number involves an array of memory cells each capable of two electric states, one of these states signifying a "1" and the other a "0".

It is well known that a memory element can be composed from two conventional inverters in a so-called flip-flop arrangement. However, the negative current-voltage characteristics of the tunnel diode enables construction of a simpler memory since the current through a tunnel diode may either cause a small, or else a significantly larger voltage drop, depending on whether the diode operates in the so-called tunnel mode, or else in the thermal mode. The thermal mode is found in any p-n junction diode and involves carrier flow over the junction potential barrier by thermal activation when that barrier has been lowered sufficiently by the applied forward voltage. On the other hand, in the tunnel mode, the barrier is crossed by tunneling of electrons from the conduction band to the valence band. Tunnelling requires a very narrow barrier such as exists only in the abrupt junction between highly doped p and n regions.

Early tunnel diode inverter circuits used bipolar transistors rather than field-effect transistors. Furthermore, they operated the tunnel diode under conditions causing fairly large current flow in the thermal mode. This led to accelerated aging as demonstrated by Gold and Weisberg, *Solid State Electronics* 7, pp. 811-821, 1964. As a consequence, tunnel diode logic and memory circuits have all but disappeared in the last decade until I disclosed in the Patent Application the advantages of combining tunnel diodes with field effect transistors in circuits in which the thermal current through the tunnel diode is restricted to not much above the valley current, thereby avoiding the above-mentioned aging effects. As an example of prior art not recognizing this important principle of operation, I cite Neff et al. U.S. Pat. No. 3,239,695, who teach operating a tunnel diode with a fairly large current which is about equal for the tunnel mode and the thermal mode.

Since modern logic system lay-out increasingly distributes memory among the data processing subcircuits, there is need of a fast, compact, low-power simple memory array compatible and integrated with the data processing. Therefore, it is one objective of this invention to disclose an improved memory cell design involving micro-tunnel diodes and field effect transistors.

It is another objective of this invention to provide an improved memory cell design which is compatible with, and capable of being integrated with, high speed GaAs logic.

It is another objective of this invention to provide an improved production method for circuits requiring field effect transistors of two different threshold voltages.

These and other objectives will become apparent from the following description.

SUMMARY OF THE INVENTION

The improved random access static memory cell circuit combines a micro-tunnel diode with a switching circuit using field effect transistors, and with a read-address and read-out circuit using also at least one field effect transistor. Depending on the polarities and magnitudes of the voltages applied at the memory cell through the word line and bit line, the current fed to the node between tunnel diode and switching circuit can be above the peak current, between peak and valley currents, or below the valley current, respectively, of the tunnel diode. The first-mentioned situation is used for writing a "0" into the memory cell, and the last-mentioned case is used for writing a "1"; the remaining intermediate case does not change the information stored in the cell.

Precise control of two different threshold voltages for field effect transistors in the memory cell is achieved by using a MESFET and a JFET on n-channels of the same doping profile.

BRIEF DESCRIPTION OF THE DRAWINGS

FIG. 1 is part of a memory array according to this invention.

FIGS. 2a-2e show transistor configurations which may be used in the write and read circuits of my invention.

FIG. 5 is another preferred embodiment of a memory cell of my invention.

FIG. 6 is yet another preferred embodiment of a memory cell of my invention.

FIG. 7 shows a cross section through an inverter using a normally-off enhancement mode JFET and a normally-on depletion mode MESFET constant current load according to my invention.

PREFERRED EMBODIMENTS

Figure 3:
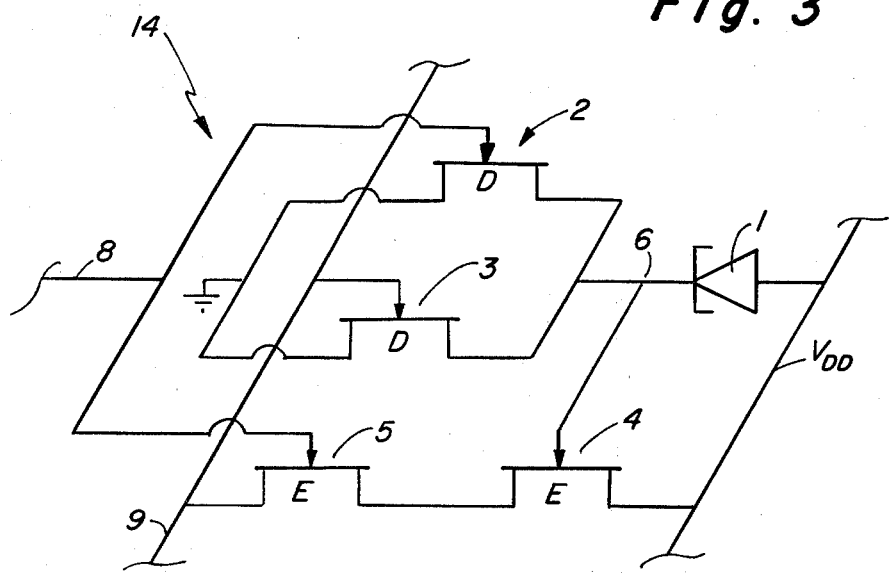
FIG. 3 is a preferred embodiment of a static random access memory cell of my invention.

FIG. 1 shows a 2×2 memory array including word line decoder 10 and bit line decoder 11 which supply electric signals to word lines 8 and 8' and to bit lines 9 and 9' respectively. At the crossovers of each word line with each bit line there are located memory cells 14, 14', 14", 14''', each cell consisting of a tunnel diode 1, 1', 1", 1''', and circuitry 21, 21', 21", 21''' for writing logic "0" and "1", and circuitry 22, 22', 22", 22''' for read-address and read-out of the logic state of the memory cell. The cells are powered by a supply voltage $V_{DD}$ common to all cells. Each cell has also a ground connection not shown in the block diagram. Preferred embodiments for the write circuit 21 and the read circuit 22 involve the following configuration of field effect transistors, illustrated in FIGS. 2a–2e:

Two depletion mode FETs in a parallel connection with the gate voltage of one supplied by the word (x) line and that of the other supplied by the bit (y) line (FIG. 2a). This configuration provides an OR-gate.

A dual gate enhancement mode FET (FIG. 2b) or else two enhancement mode FETs in series (FIG. 2c) provide an AND-gate.

An enhancement mode FET with gate connected to the x-line and source connected to the y-line (FIG. 2d) or vice versa (FIG. 2e).

FIG. 3 shows a memory cell in which the configuration of FIG. 2a is used for writing "1" and "0", and the configuration of FIG. 2d is used in the read-address and read-out circuit. The sense transistor 4 is inserted between node 6 and the drain of the read-out transistor 5 to buffer that node against current flow in the read-out circuit. The transistor 4 is of the enhancement type and is conducting when the node 6 is high, i.e., at logic "1", but is non-conducting when the node 6 is low. i.e., at logic "0". Thus when the read-address transistor 5 is made conducting by applying a positive voltage to the word line 8 and a negative voltage to the bit line 9, and corresponding gate-to-source voltage for transistor 5 exceeds its threshold voltage, a current will flow in the bit line 9 only if cell 14 is in the logic "1" state. No current will be contributed from the other cells on the same y-line 9 in a memory array, such as cell 14' in FIG. 1, if the bit line of the non-addressed cells, i.e., line 8' in FIG. 1, is kept at ground, and the voltage difference between ground and the negative potential applied at the bit line 9 is less than the threshold voltage of the enhancement mode transistor 5.

Figure 4:
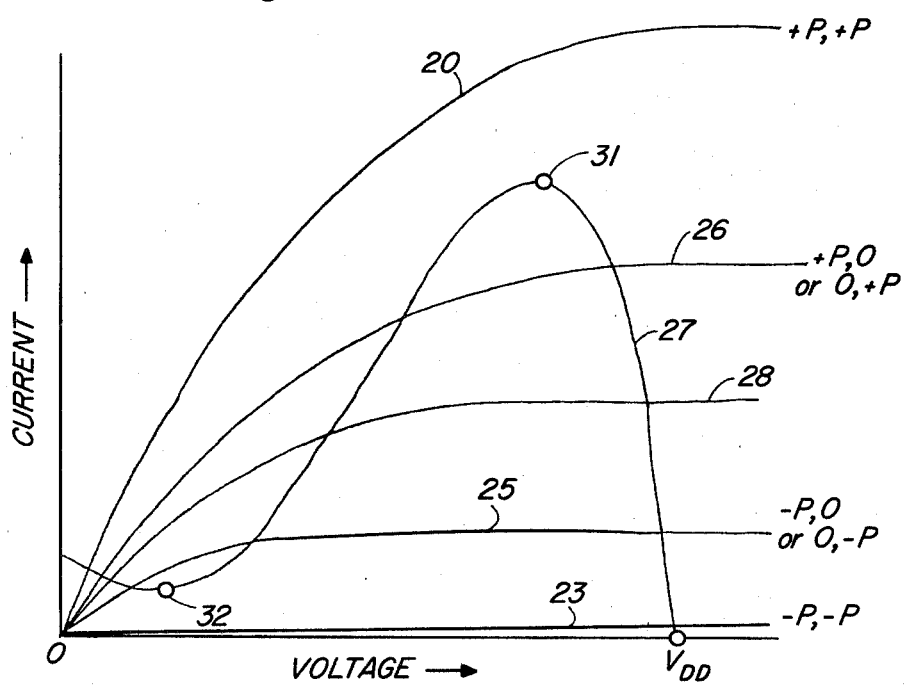
FIG. 4 shows the tunnel diode characteristics and current-voltage characteristics of the auxiliary circuits of FIG. 1 for various bit and word line voltages.

The write circuit 21 of FIG. 1 in the embodiment of FIG. 3 consists of the depletion mode transistors 2 and 3. No current is supplied by these transistors to node 6, thus writing "1", if the voltages on both lines 8 and 9 are more negative than the negative threshold voltage of the transistors 2 and 3. FIG. 4 shows the tunnel diode characteristics 27 and the combined I-V characteristics 23 of the transistors 2 and 3 for this case identified by the symbols −P, −P for the bit and word line voltages. On the other hand, if the combined drain currents 20 of 2 and 3 for positive voltages supplied by both lines 8 and 9 exceed the peak current 31, as shown in FIG. 4, a "0" is written into the cell.

Change of logic content of other cells than that into which "1" or "0" is being written, and also change of logic content by read-address of a cell, is prevented if (i) the current through one of the transistors 2 or 3 at zero gate voltage exceeds the valley current 32 as shown by 25 in FIG. 4, but the sum of currents at gate of one of the transistors 2 or 3 at zero voltage and the gate of the other transistor at positive voltage is less than the peak current 31, as shown by 26 in FIG. 4.

In order to increase the spread between the write "0" characteristics 20 and the characteristics 26, into which the peak current 31 must fall, the transistors 2 and 3 can be shunted by an AND-gate of the type in FIG. 2b or 2c, as exemplified by the dual gate transistor 7 in FIG. 5.

Another embodiment is shown in FIG. 6, in which the transistor 11 of the type in FIG. 2e is employed to write "0". A positive signal at line 9 and a negative signal at line 8 are employed in this case to provide the write "1" current for node 6.

Another modification of the circuit of FIG. 3 introduced in FIGS. 5 and 6 is the elimination of the sense transistor 4 and direct coupling of the node 6 to the drain of the read-address transistor 5 in FIG. 6, and coupling over a level shift forward biased ordinary diode in FIG. 5. The different read-currents result then from the transistor 5 operating in saturation when the addressed cell 14 is at logic "1" and in the non-saturation regime when the addressed cell is at logic "0". The sum 28 of the read-current through transistor 5 at logic "1" and of the current through transistor 2 has then to be less than the peak current 31 of the tunnel diode to prevent switching to logic "0" upon readout of "1".

Choice of a supply voltage $V_{DD}$ not much larger than voltage across the tunnel diode which pertains to the valley current 32, as shown in FIG. 4, precludes significant thermal current flow through the tunnel diode and thus prevents the ageing by thermal current flow. In the case of the direct coupling of the read-address transistor to the node 6 without sense transistor 4, as shown in FIG. 6, the difference between supply voltage $V_{DD}$ and negative voltage −P applied at read-out line 9 must not be much larger than the voltage across the tunnel diode corresponding to the valley current. In the case of FIG. 5 this condition is relaxed by the voltage drop across the level shift diode 12.

The preferred material for my memory cell is GaAs, although other III-V compounds and Si can be used. Typical threshold voltages for the transistors in the circuit of FIG. 3 made from GaAs, and operating voltages are:

Threshold voltage of transistors 2 and 3: −0.25 V; threshold voltages of transistors 4 and 5: +0.3 V; supply voltage $V_{DD}$ =0.5 V, and voltages supplied from the decoders ±0.25 V for the addressed lines and 0 V for the non-addressed lines. A typical threshold voltage for transistor 7 is about +0.1 V, and for transistor 11 it is about +0.3 V. The conditions for current lines illustrated in FIG. 4 can be met by suitable choice of gate length and gate width of the transistor, as is well known to those skilled in the art.

Threshold voltage control is the most difficult problem in state-of-the art GaAs logic circuits. This control requires achievement of a precisely prescribed dopant distribution in the channel of the transistors. The dopant is typically introduced by ion implantation, but its conversion into active centers by subsequent annealing is incomplete and subject to variations beyond present production.

Nevertheless, one closely prescribed threshold voltage level can be achieved by reducing the GaAs n-channel by anodization, as mentioned by G. Bert et al, in *Electronic Letters*, Vol. 13, No. 21, pp. 644, 645, October 1977. However, it was hitherto not possible to control closely two threshold voltage levels in the same circuit. Thus the pull-up transistor load which requires a normally-on transistor of negative threshold voltage is used in the Schottky Diode FET Logic of Eden et al., in IEEE *J. Solid-State Circuits,* Vol. SC-13, pp. 419–425, August 1978, and in the Buffered FET Logic of Van Tuyl and Liechti, in IEEE *J. Solid-State Circuits,* Vol. SC-9, pp. 269–276, October 1974, since the switching transistors in these circuits have the same negative threshold voltages. On the other hand, the pull-up transistor constant current load is usually not used in Direct Coupled Logic, since the switching transistor in this logic is a normally-off device of positive threshold voltage, while the constant current transistor load requires a transistor with negative threshold voltage. The difficulty of closely controlling two different threshold voltages has been overcome by my invention by using the same closely controlled dopant distribution for all transistors in my circuits; I generate normally-on devices of negative threshold voltage and normally-off devices of positive threshold voltage by using, respectively, Schottky barrier and p-n junction gates. The built-in potentials for these gates differ by about 0.5 V in GaAs, and the threshold voltages differ accordingly. In addition, there is a further difference of about 0.1 V generated by locating the p-n junction about 100 A below the wafer surface. Thus the transistors 4 and 5 in FIG. 3 are JFETs, while the transistors 2 and 3 are MESFETs, all made with the same ion-implanted n-type dopant distribution in a semi-insulating GaAs substrate.

FIG. 7 shows an inverter circuit according to my invention using a JFET switching transistor 40 of threshold voltage +0.25 V and a MESFET pull-up load transistor 41 of threshold voltage −0.25 V, both having the same dopant distribution in their n-channels. The circuit is well suited for Direct Coupled Logic with supply voltage $V_{DD}$ of about 1 V. The ohmic contacts 43 to the n+ source and drain regions 44 provide the contacts for ground, supply voltage $V_{DD}$, and output, as indicated. The Schottky barrier gate 45 is connected to the source contact 43 of the MESFET 41 to generate the constant current load. The p+ gate 46 of the JFET 40 provides the input contact as indicated. The dopant distribution in the N-Channels 47 of the transistors are identical.

As there are many modifications of my invention, said invention should not be limited by the special embodiments here described, but should be understood to encompass all circuits and procedures described by the following claims:

I claim:

1. An array of static memory cells, each cell comprising a tunnel diode inserted between a supply voltage and a first circuit, said supply voltage not much larger than the voltage drop across said tunnel diode pertaining to valley current flow so that the current through said tunnel diode when operating outside the tunnel regime never exceeds significantly the valley current, a variety of currents through said first circuit in response to sets of voltage signals applied at said first circuit through two circuit lines commonly referred to as word and bit lines, a first set of said signals such that the corresponding current withdrawn through said first circuit from the node between said tunnel diode and said first circuit is larger than the peak current of said tunnel diode, a second set of said signals such that the corresponding current through said first circuit is less than the valley current of said tunnel diode, the current through said first circuit being less than said peak current but higher than said valley current for any said set of voltage signals other than said first and second sets, a second circuit connected to said node between said tunnel diode and said first circuit, the impedance of said second circuit depending on voltage signals applied at said second circuit from said word and bit lines, said second circuit conducting only when a third set of said signals is applied, but non-conducting for any other set of said signals, the current through said conducting second circuit indicative of the voltage across said tunnel diode, thereby providing a read-out of the logic state of the memory cell, said first and second circuits comprsing field effect transistors.

2. The memory cell of the array of claim 1 whereby said first circuit comprises two depletion mode field effect transistors in parallel connection, the drains of said two field effect transistors connected to said node, and the sources of said field effect transistors connected to ground, the gate of one of said field effect transistors connected to said word line and the gate of the other of said field effect transistors connected to said bit line.

3. The memory cell of the array of claim 2 whereby said first circuit includes an AND-gate consisting of a dual gate enhancement mode transistor, with one gate of said dual gate transistor connected to said word line, and the other gate of said dual gate transistor connected to said bit line.

4. The memory cell of the array of claim 2 whereby said first circuit includes an AND-gate consisting of two enhancement mode transistors in series, the gate of one of said transistors of said AND-gate connected to said word line and the gate of said other transistor of said AND-gate connected to said bit line.

5. The memory cell of the array of claim 2 whereby said first circuit includes an enhancement mode transistor with one contact from the pair of gate and source contacts connected to said bit line, the other contact from said pair of gate and source contacts connected to said word line.

6. The memory cell of the array of claim 1 whereby said second circuit comprises a field effect transistor with said word line in circuit connection with one contact from the pair of gate and source contacts of said field effect transistor in said second circuit, and said bit line in circuit connection with said other one contact of said pair.

7. The memory cell of the array of claim 6 whereby said node is connected to the drain of said field effect transistor in said second circuit.

8. The memory cell of the array of claim 6 whereby a forward biased ordinary diode is inserted between said node and the drain of said field effect transistor in said second circuit.

9. The memory cell of the array of claim 1 whereby said first circuit comprises an OR-gate of two depletion mode field effect transistors, the drains of said two field effect transistors in circuit connection to said node, and the sources of said two field effect transistors in circuit connection with ground, the gate of one of said two field effect transistors connected to said word line, and the gate of the other of said two field effect transistors connected to said bit line, a third field effect transistor in said first circuit, with the drain of said third field effect transistor in circuit connection with said node, the gate of said third field effect transistor in circuit connection with one from the pair of said word and bit lines, and the source of said third field effect transistor in circuit connection with the other from the pair of said word and bit lines, said third field effect transistor being of the enhancement mode type, said second circuit comprising a fourth field effect transistor, said fourth field effect transistor of the enhancement mode type, the source of said fourth field effect transistor in circuit connection with one from the pair of said word and bit lines, and the gate of said fourth field effect transistor in circuit connection with the other from said pair of word and bit lines, the gate of said fourth field effect transistor in said second circuit in circuit connection with a different line from said pair of word and bit lines than the gate of said third field effect transistor in said first circuit.

10. The memory cell of the array of claim 1 whereby said node is connected to the gate of an enhancement field effect transistor in said

* * * * *